(12) United States Patent
Blumenthal et al.

(10) Patent No.: US 10,032,304 B1
(45) Date of Patent: Jul. 24, 2018

(54) AUTOMATIC CREATION OF TEMPORARY RIGID RELATIONSHIPS BETWEEN MOVING PARTS IN MOTION SIMULATION

(71) Applicant: Dassault Systemes SolidWorks Corporation, Waltham, MA (US)

(72) Inventors: David Blumenthal, Marlborough, MA (US); Kyeong Hwi Lee, Lexington, MA (US); Shrikant Vitthal Savant, Shrewsbury, MA (US)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 24 days.

(21) Appl. No.: 15/396,103

(22) Filed: Dec. 30, 2016

Related U.S. Application Data

(60) Provisional application No. 62/273,838, filed on Dec. 31, 2015.

(51) Int. Cl.
  *G06T 19/20* (2011.01)
  *G06T 13/20* (2011.01)
  *G06F 17/50* (2006.01)
  *G06F 3/0484* (2013.01)

(52) U.S. Cl.
  CPC .......... *G06T 13/20* (2013.01); *G06F 3/04845* (2013.01); *G06F 17/5009* (2013.01); *G06T 19/20* (2013.01); *G06T 2219/2004* (2013.01)

(58) Field of Classification Search
  CPC . G06T 13/20; G06T 19/20; G06T 2219/2004; G06F 17/5009; G06F 3/04845
  See application file for complete search history.

(56) References Cited

U.S. PATENT DOCUMENTS

| | | | |
|---|---|---|---|
| 2004/0215441 A1* | 10/2004 | Orofino, II | G06F 8/10 703/22 |
| 2006/0217945 A1* | 9/2006 | Leprevost | G06F 17/11 703/2 |
| 2007/0271507 A1* | 11/2007 | Connor | G06F 17/50 345/418 |

* cited by examiner

*Primary Examiner* — Tapas Mazumder
(74) *Attorney, Agent, or Firm* — Hamilton, Brook, Smith & Reynolds, P.C.

(57) ABSTRACT

A computer-implemented method and system automatically manages relationships between moving parts of a computer-aided design model. Two parts are selected, the parts being structurally independent of one another. One of the parts is determined to be a driving part and the other part is determined to be a driven part. A new position is applied to the driving part, and temporary constraints between the driving part and the driven part are added. A constraint solver is executed to move the two parts into solved positions. Additionally, after execution of the constraint solver, the added temporary constraints are removed.

19 Claims, 3 Drawing Sheets

AUTOMATIC CREATION OF TEMPORARY RIGID RELATIONSHIPS BETWEEN MOVING PARTS IN MOTION SIMULATION

RELATED APPLICATION

This application claims the benefit of U.S. Provisional Application No. 62/273,838, filed on Dec. 31, 2015. The entire teachings of the above application are incorporated herein by reference.

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to topological faces bounded by edges. Hereinafter, the terms vertex, edge, and face will be used interchangeably with their respective, corresponding geometric entities.

A design engineer is a typical user of a 3D CAD system. The design engineer designs physical and aesthetic aspects of 3D models, and is skilled in 3D modeling techniques. The design engineer creates parts and may assemble the parts into a subassembly or an assembly. A subassembly may also consist of other subassemblies. An assembly is designed using parts and subassemblies. Parts and subassemblies are hereinafter collectively referred to as components.

During the design process, an engineer may simulate the design of a model to analyze and evaluate the motion of moving parts of the product being designed. Typically, simulation software applies physical and scientific properties. Such a simulation may be executed by an engineering simulation process, examples of which are SolidWorks® Motion, SolidWorks® Simulation Xpress, and SolidWorks® Simulation, which use the CAD model data to set up and execute motion or simulation studies and are available from Dassault Systemes SolidWorks Corporation of Waltham, Mass.

Rather than setting up and executing a simulation of a model, a user may choose to animate the moving parts without taking into account all physical and scientific properties. Setting up and running an animation versus a simulation is generally less time consuming and gives a user more immediate feedback with regards to the feasibility of a design.

A problem arises when creating an animation to simulate the relationships between moving parts when the relationships change over the course of the animation. In general, animation software applications allow a user to define a hierarchical relationship among the parts of a model. More sophisticated simulation software applications automatically define a hierarchical relationship from the relationships created during the model design phase. Both approaches work well for structurally connected models, for example, a robotic arm. However, consider a robotic arm gripper manipulating an object. At times the gripper is not grasping the object, for example before the object is picked up by the gripper and after the object is placed in another location by the gripper. At other times though, the gripper is holding the object and the object moves with the gripper. The gripper and the object are not structurally related, and the user cannot define a static rigid relationship between the two.

Software used to animate objects commonly allow the user to define a relationship and then switch the relationship on and off over the course of the animation. However, such an approach is not intuitive. The user must explicitly predefine all the relationships that may be needed over the entire animation, and the user must explicitly enable and disable those relationships at exactly the right times to make the parts move together or not move together as needed. The present invention avoids the problem of requiring a user to explicitly define in advance all the parts that may be directly moved and all the temporary relationships that may be required over the course of an animation or a simulation.

SUMMARY OF THE INVENTION

In general, in one aspect, embodiments of the invention feature a computer-implemented method for automatically managing relationships between moving parts of a computer-aided design model. The method selects a first part and a second part, where the parts are structurally independent of one another. Which of the parts is a driving part and which a driven part is determined. The method applies a new position. A change from an initial position to the new position define a motion. Furthermore, the method adds temporary constraints between the driving part and the driven part if the new position applies to the driving part. A constraint solver is executed to move the parts into solved positions. And, the temporary constraints are removed.

In embodiments of the invention the temporary constraints are defined directly in the constraint solver and the parts are solved as a single rigid body. In another embodiment, a target position is interpolated for the driving part, the temporary constraints are added between the driving part and the driven part, and the constraint solver moves the parts into a solved position that together are incorporated into the target position.

In additional embodiments, adding temporary constraints between the driving part and the driven part is performed automatically and determined by the structural relationship of the driving part and the driven part at the new position. Moreover, the first and second solved positions are included in a script that specified the animation.

Other embodiments include reading the script and calculating one or more additional positions between the first and second position. Still other embodiments calculating one or more additional positions for the driving part and the driven part, where calculating includes executing the constraint solver to solve for the one or more additional positions, providing temporary constraints to the constraint solver where the temporary constraints rigidly constrain the driving part and the driven part, and moving the driving part and the driven to respective solved positions.

Other embodiments include a computer-aided design (CAD) system having a processor operatively coupled to a data storage system and a data storage memory operatively coupled to the processor. In such embodiments, the data storage system stores a three-dimensional model, and the data storage memory comprises instructions to configure the processor to select two parts that are structurally independent of one another, determine which of the parts is a driving part and which is a driven part, and apply a new position to the driving part, and add temporary constraints between the driving part and the driven part. Further instructions configure the processor to execute a constraint solver to move the parts into respective solved positions, and remove the temporary constraints.

In embodiments of the CAD system, the structural relationship of the driving and the driven parts at the new position automatically determine the temporary constraints to add. Furthermore, the temporary constraints are defined directly in the constraint solver and the first and second parts are solved as a single rigid body. Additionally, the first and second solved positions may define frames in an animation sequence, and the first and second solved positions may define frames in an animation sequence.

Embodiments of the CAD system also may include instructions to configure the processor to add the temporary constraints based on a user interface gesture to move the first and second parts rigidly together. Yet other embodiments of the CAD system include instructions to configure the processor to calculate additional frames in the animation sequence, where the additional frames are between the first solved position and the second solved position, construct additional constraints to rigidly tie the driving part and the driven part together, and execute the constraint solver, wherein the additional constraints are input to the constraint solver and the additional frames are output by the constraint solver.

Yet other embodiments include a non-transitory computer-readable data storage medium comprising instructions that cause a computer to select two parts that are structurally independent of one another, determine which of the parts is a driving part and which is a driven part, and for the driving part, apply a new position, and add temporary constraints between the driving part and the driven part. Further instructions configure the processor to execute a constraint solver to move the parts into respective solved positions, and remove the temporary constraints.

In embodiments of the computer-readable data storage medium, the structural relationship of the driving and driven parts at the new position automatically determine the temporary constraints to add, the temporary constraints are defined directly in the constraint solver and the first and second parts are solved as a single rigid body, and/or the first solved position and the second solved position define frames in an animation sequence.

Embodiments of the computer-readable data storage medium may also include instructions to configure the processor to add the temporary constraints based on a user interface gesture to move the first and second parts rigidly together. Yet additional instructions may include calculating additional frames in the animation sequence, where the additional frames are between the first solved position and the second solved position, constructing additional constraints to rigidly tie the driving part and the driven part together, and executing the constraint solver, where the additional constraints are input to the constraint solver and the additional frames are output by the constraint solver.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The foregoing will be apparent from the following more particular description of example embodiments of the invention, as illustrated in the accompanying drawings in which like reference characters refer to the same objects throughout the different views. The drawings are not necessarily to scale, emphasis instead being placed upon illustrating embodiments of the present invention.

DETAILED DESCRIPTION OF THE INVENTION

Figure 1:
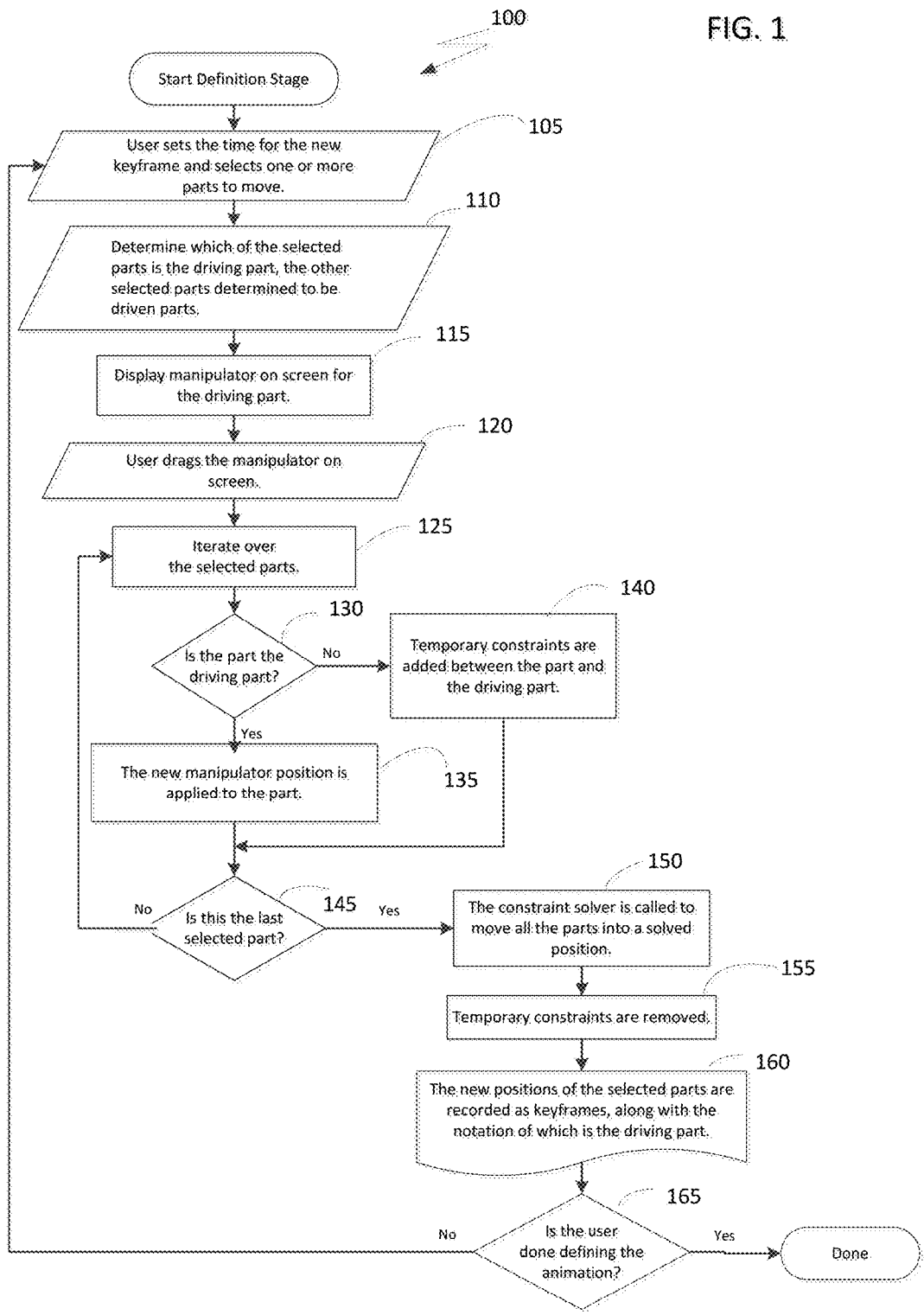
FIG. 1 is a flow diagram containing steps for defining an animation.

The present invention automatically creates and dissolves relationships between moving parts in an animation or a simulation of a computer-aided design (CAD) model when there are no preexisting structural relationships between those parts. The relationships created and resolved are based on a user's actions and implied intent while defining the animation or the simulation. Hereinafter, the present invention will be described in the context of an animation process; however, the present invention may be equally applicable to a simulation process.

As a practical example, consider a robotic arm consisting of multiple linkages and a gripper, and an independent object of the type that the robotic arm might manipulate. Suppose the user wishes to animate the robotic arm picking up the object, moving it, and setting it down in another location. At all times in the animation, the linkages and gripper of the robotic arm will be related to one another through constraints (e.g., established mating relationships), and the motions of the linkages and gripper can be described in relative terms. For example, if the base of the arm moves, the rest of the arm will automatically move because of a structural relationship that defines how the linkages and gripper are connected. However, the object is not structurally attached to the gripper. There are times in the animation when the object may move independently from the gripper and vice versa. But there are other times when the object will be held by the gripper and the two should move as a rigid assembly through what may be a complex spatial path. During these times, the user's intent is that a rigid relationship exists between the gripper and the object. The present invention automatically creates this relationship based on the user having selected both the gripper and the object and then having moved them together. Furthermore, the present invention records the existence of this relationship in a script of the animation thereby allowing the animation to be recreated upon play back.

In general, when a user moves a part while defining a model and/or while defining an animation, and when an animation is calculated to generate all frames between key frames so the animation may be played back, a user explicitly adds constraints (e.g., establishes mating relationships), between parts to define how the parts are positioned and can move relative to one another. These constraints are used as inputs to a constraint solver when a part is repositioned, so the model moves in a consistent and reasonable way.

The present invention frees the user from explicitly adding additional constraints to the model to enable two structurally unrelated parts to move together. Not explicitly adding constraints has the benefit that the two parts can also move independently without any additional steps by the user.

Moreover, the present invention identifies the user's intent to have two parts move together through an intuitive gesture that is a part of a normal workflow of defining an animation; in one embodiment, the present invention determines such intent when input is received indicating that the user selected more than one part to drag at the same time.

When the present invention determines the intent to move two parts together, additional constraints are automatically added to the model such that the two parts move rigidly together while the user drags the parts. These additional constraints are dissolved automatically when the user stops dragging the parts. The user does not ever see the additional constraints listed among the explicitly defined constraints of the model. While the animation is being defined, an animation script is created and records the two parts moving together. Another aspect of the present invention is that the same additional constraints are automatically added to the model when calculating the relevant portion of the animation, and thus, the calculated animation shows the two parts moving together at the appropriate times.

To create an animation, the user defines key frames by setting a time indicator (e.g., in an animation timeline display), and then moves parts by dragging manipulators on the computer screen to position the parts as desired for that particular time. In an embodiment, the user may select more than one part by using a mouse or other pointing device to select the parts on the computer screen, then drag a user interface manipulator on the computer screen to move all the selected parts simultaneously. Additional constraints are created automatically, as previously discussed, and the parts then move rigidly together. The appropriate information is recorded in the animation script and the animation is correctly calculated. The user can unselect the parts by again selecting the parts on the computer screen or by clearing a selection field in an animation dialog displayed in the user interface. Unselecting the parts indicates that the user no longer has the intent to move the parts together.

The present invention includes a process for defining an animation and a process for calculating the animation. These processes may be independent of one another and may overlap in time. For example, an embodiment of the present invention recalculates the animation each time the user makes a change, and therefore, the calculation process runs repeatedly while the definition process is ongoing.

Referring now to FIG. 1, a definition process 100 is shown. In general, the definition process 100 takes as inputs a set of selected parts, and new and previous positions of a user interface manipulator where the new and previous positions define the desired motion. The definition process 100 moves all selected parts when the user drags a manipulator on a computer screen and writes the resulting key frame positions to an animation script.

To begin definition process 100, the user sets the time for a new key frame and selects one or more parts to move (step 105). The new key frame may be the first key frame or a later key frame in subsequent iterations of the definition process. In the next step, a determination is made as to which of the selected parts is the driving part and which are the driven parts (step 110). When two or more parts are selected, the definition process 100 identifies the first selected part as the driving part and the other parts as driven parts, meaning that the motion of the driving part drives the motions of the driven parts. Other embodiments may determine the driving part by other or additional means, for example, by allowing the user to explicitly designate the driving part.

Next, a manipulator is displayed in the user interface for the purpose of moving the selected driving part (step 115). The user may then drag the manipulator using a pointing device on the computer screen (step 120). Then the process 100 performs an inner iteration loop (step 125), which determines if the selected part is the driving part (step 130). If the selected part is the driving part, definition process 100 applies the manipulator to the driving part (step 135). If the selected part is not the driving part, temporary rigid constraints are added between the selected part and the driving part (step 140). The definition process 100 defines the temporary rigid constraints directly to the constraint solver so that all the selected parts will be solved as a single rigid body. In the next step, definition process 100 determines if more selected parts exist (step 145) and if so, executes the inner iteration loop (step 125) again; otherwise, a constraint solver is executed to move all the parts into a solved position (step 150). If only one part is selected, the definition process 100 applies the change in the manipulator position (i.e., the indication of the desired motion), to the selected part's position, and then calls the constraint solver to update the positions of all the parts in the model such that the explicitly defined constraints are satisfied. In process 100, the temporary rigid constraints are added and removed, but the explicitly defined constraints remain in the constraint solver once defined.

After the definition process 100 applies the change in the manipulator position to the driving part's position and calls the constraint solver to update the positions of all the parts in the model, the temporary rigid constraints are deleted from the constraint solver (step 155). Then, for each selected part, definition process 100 reads the solved position of the part and writes that solved position to an animation script as the key frame position for that respective part at the current animation time. If the part is a driven part, the identity of the driving part is also included with the key frame data (step 160). If the user is then done defining the animation (tested in step 165), definition process 100 exits; otherwise definition process 100 accepts input from the user specifying a new time for a new key frame and selects one or more parts to move (step 105), after which the definition process continues through another iteration of the steps described.

Figure 2:
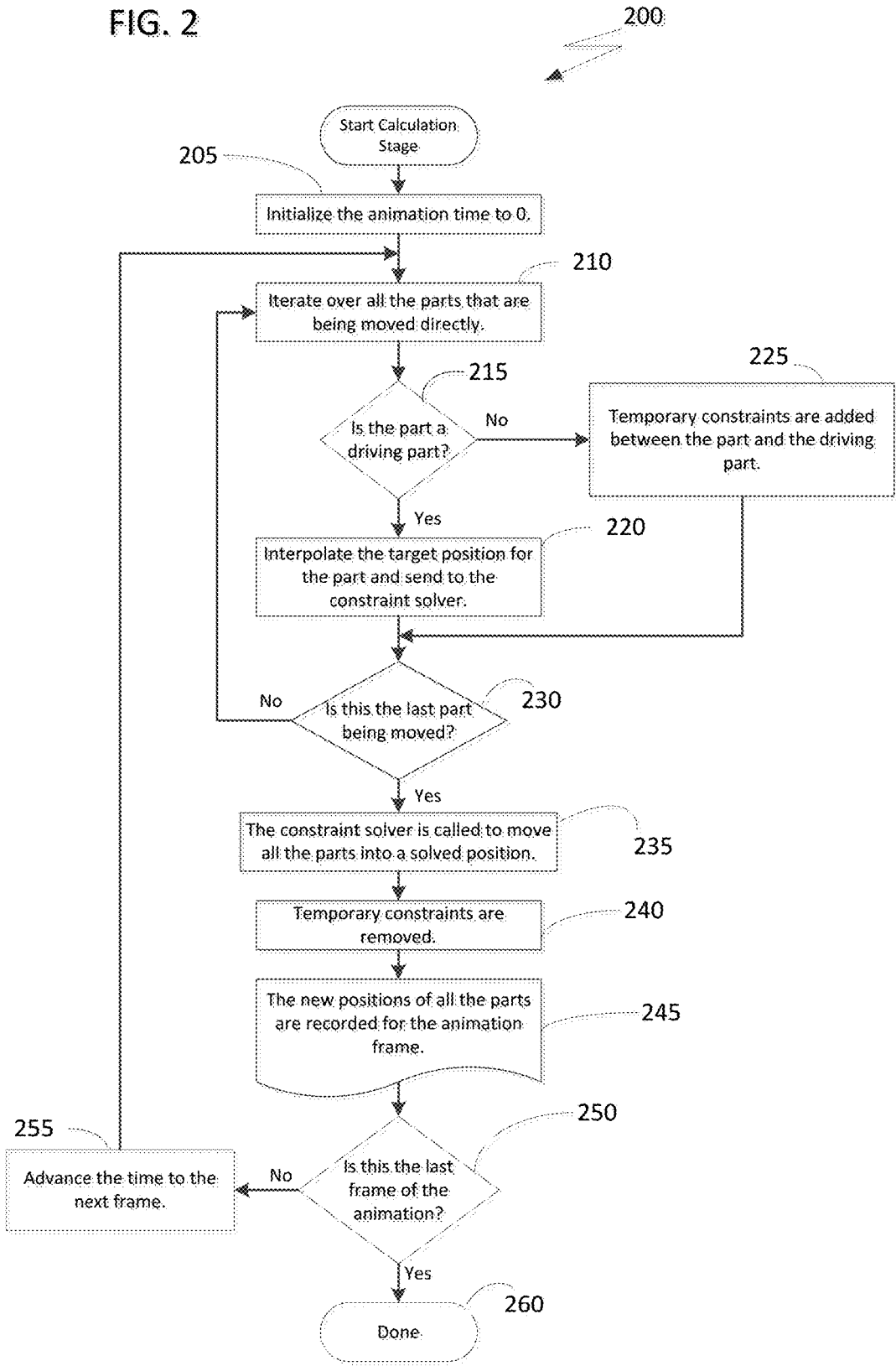
FIG. 2 is a flow diagram containing steps for calculating an animation.

Referring now to FIG. 2, a calculation process 200 is shown. The calculation process 200 steps through the animation script (created by definition process 100), one frame at a time and calculates where each part should be at that time. The calculation process 200 keeps track of what parts are being moved directly by key frames at the current time (i.e., which parts have a key frame or are between key frames at the current time). The calculation process 200 begins by initializing the time to 0 (step 205). Then to calculate an animation frame, the calculation process 200 performs an iteration loop for each part that is directly being moved (step 210). Here, a part that is directly being moved is a part that has a key frame or is between key frames at the current time; this is distinguishable from a part that does not have key frames and that may be moved solely by virtue of one of more constraints between the part and other moving parts.

For each part, the calculation process 200 determines if the part is specified as a driving part (step 215), and if so interpolates a target position for the part where the position is between the previous and next key frame positions and enters that new position into the constraint solver for the part (step 220). If the part is specified as a driven part, the calculation process 200 adds temporary rigid constraints between the part and the driving part to the constraint solver (step 225). These temporary constraints are the necessary constraints that rigidly tie the part to the corresponding driving part.

Once all the parts have been handled thusly (as tested in step 230), the constraint solver executes and moves all the parts to solved positions such that all the constraints are satisfied (step 235). Then, any temporary constraints are deleted from the constraint solver (step 240), and the new computed positions for all the parts in the model are recorded into the calculated results of the animation (step 245). The calculation process 200 then tests whether the current frame is the last frame of the animation (step 250), and if not, the animation advances to the next frame (255), and repeats the iteration loop (step 210) until the end of the animation is reached (260).

Figure 3:
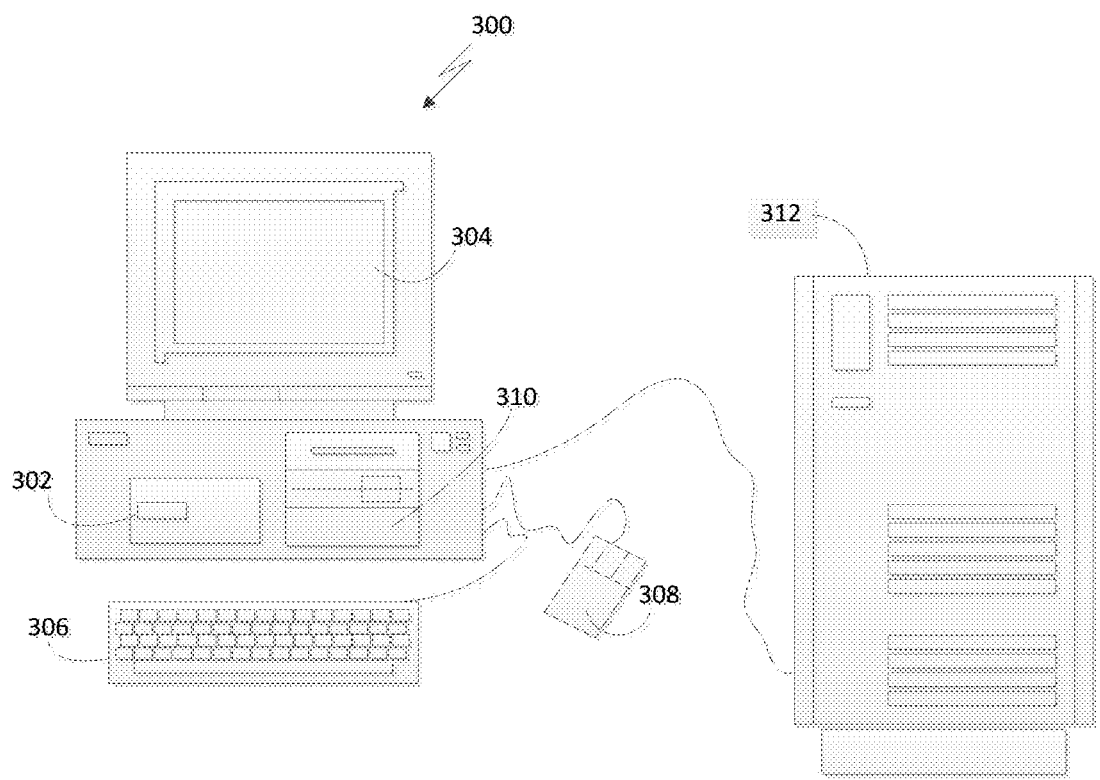
FIG. 3 is a schematic diagram of a computer system in which embodiments of the present invention may be implemented.

Referring now to FIG. 3 illustrates a computerized modeling system 300 that includes a CPU 302, a computer monitor 304, a keyboard input device 306, a mouse input device 308, and a storage device 310. The CPU 302, computer monitor 304, keyboard 306, mouse 308, and storage device 310 can include commonly available computer hardware devices. For example, the CPU 302 can include an Intel-based processor. The mouse 308 may have conventional left and right buttons that the design engineer may press to issue a command to a software program being executed by the CPU 302. As an alternative or in addition to the mouse 308, the computerized modeling system 300 can include a pointing device such as a mouse, stylus, touch-sensitive pad, or pointing device and buttons built into the keyboard 306. Those of ordinary skill in the art appreciate that the same results described herein with reference to a mouse device can be achieved using another available pointing device. Other appropriate computer hardware platforms are suitable as will become apparent from the discussion herein. Such computer hardware platforms are preferably capable of operating the Microsoft Windows® 7, UNIX, Linux, or MAC OS operating systems.

Additional computer processing units and hardware devices (e.g., rapid prototyping, video, and printer devices) may be included in the computerized modeling system 300. Furthermore, the computerized modeling system 300 may include network hardware and software thereby enabling communication to a hardware platform 312, and facilitating communication between numerous computer systems that include a CPU and a storage system, among other computer components.

Computer-aided modeling software (e.g., processes 100 and 200) may be stored on the storage device 310 and loaded into and executed by the CPU 302. The modeling software allows a design engineer to create and modify a 3D model and implements aspects of the invention described herein. The CPU 302 uses the computer monitor 304 to display a 3D model and other aspects thereof as described. Using the keyboard 306 and the mouse 308, the design engineer can enter and modify data associated with the 3D model. The CPU 302 accepts and processes input from the keyboard 306 and mouse 308. The CPU 302 processes the input along with the data associated with the 3D model and makes corresponding and appropriate changes to that which is displayed on the computer monitor 304 as commanded by the modeling software. In one embodiment, the modeling software is based on a solid modeling system that may be used to construct a 3D model consisting of one or more solid and surface bodies.

Embodiments of the invention may be implemented in digital electronic circuitry, or in computer hardware, firmware, software, or in combinations thereof. Apparatuses may be implemented in a computer program product tangibly embodied in a machine-readable storage device for execution by a programmable processor; and method steps may be performed by a programmable processor executing a program of instructions to perform functions by operating on input data and generating output. Embodiments of the invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Embodiments of the present invention or aspects thereof described herein may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of computer systems, environments, and/or configurations that may be suitable for use with aspects of the invention include, but are not limited to, personal computers (PCs), server computers, hand-held and laptop devices, multiprocessor systems, microprocessor-based systems, set top boxes, programmable consumer electronics, mobile telephones and mobile operating systems, network PCs, minicomputers, mainframe computers, distributed computing environments that include any of the above systems or devices, and the like. The computer system may have standalone components or workstations, or the computer system may be formed of networked computers by any of known communications networks, processing networks, cloud-based networks, related protocols and the like.

As can be appreciated, the network can be a public network, such as the Internet, or a private network such as an LAN or WAN network, or any combination thereof and can also include PSTN or ISDN sub-networks. The network can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network is merely exemplary and in no way limits the scope of the present advancements.

Advantages of the present invention include automatically creating and dissolving temporary relationships based on a user's mouse gestures. For example, after selecting two or more parts, the user may drag those parts . . . . The user does not need to explicitly predefine relationships between parts that are not permanent structural aspects of the CAD model or between parts that do not have a permanent structural relationship to one another. The user does not need to explicitly enable and disable relationships in order to form animations that are common in CAD mechanisms. Furthermore, the software is easier and more intuitive to operate for users who are not necessarily trained animation experts.

A number of embodiments of the present invention have been described. Nevertheless, it will be understood by those skilled in the art that various modifications may be made within the boundaries of the invention. For example, embodiments of the present invention may change the order in which operations are performed. Furthermore, depending on the needs of an implementation, particular operations described herein may be implemented as a combined operation, eliminated, added to, or otherwise rearranged.

What is claimed is:

1. A computer-implemented method for automatically managing relationships between moving parts of a computer-aided design model, the method comprising:
   selecting a first part and a second part, the first and second parts being structurally independent of one another;
   determining which of the first and second parts is a driving part and which of the first and second parts is a driven part in an animation;
   for one of the driving part and the driven part, applying a new position wherein a change from an initial position to the new position defines a motion;
   adding one or more temporary constraints between the driving part and the driven part if the new position is applied to the driving part;
   executing a constraint solver to move the first and second parts into a first solved position and a second solved position, respectively; and
   after execution of the constraint solver, removing the added one or more temporary constraints.

2. The computer-implemented method of claim 1, wherein:
   the one or more temporary constraints are defined directly in the constraint solver; and
   the first part and the second part are solved as a single rigid body.

3. The computer-implemented method of claim 1, further comprising:
   calculating the animation wherein:
      a target position is interpolated for the driving part;
      the one or more temporary constraints are added between the driving part and the driven part; and
      the constraint solver applying the added one or more temporary constraints moves the driving part and the driven part each into a respective solved position that together are incorporated into the target position.

4. The computer-implemented method of claim 1, wherein adding the one or more temporary constraints between the driving part and the driven part is performed automatically and determined by the structural relationship of the driving part and the driven part at the new position.

5. The computer-implemented method of claim 1, wherein the first solved position and the second solved position are included in a script that specified the animation.

6. The computer-implemented method of claim 4, further comprising reading the script and calculating one or more additional positions between the first position and the second position.

7. The computer-implemented method of claim 1, further comprising calculating one or more additional positions for the driving part and the driven part, wherein calculating comprises:
   executing the constraint solver to solve for the one or more additional positions;
   providing the added one or more temporary constraints to the constraint solver wherein the added one or more temporary constraints rigidly constrain the driving part and the driven part; and
   moving the driving part and the driven part to respective solved positions.

8. A computer-aided design system comprising:
   a processor operatively coupled to a data storage system, the data storage system storing a three-dimensional model; and
   a data storage memory operatively coupled to the processor and comprising instructions to configure the processor to:
      select a first part and a second part, the first and second parts being structurally independent of one another;
      determine which of the first and second parts is a driving part and which of the first and second parts is a driven part;
      apply a new position to one of the driving part and the driven part;
      add one or more temporary constraints between the driving part and the driven part if the new position is applied to the driving part;
      execute a constraint solver to move the first and second parts into a first solved position and a second solved position, respectively; and
      after execution of the constraint solver, remove the added one or more temporary constraints.

9. The computer-aided design system of claim 8, wherein the structural relationship of the driving part and the driven part at the new position automatically determines the one or more temporary constraints to add.

10. The computer-aided design system of claim 8, wherein:
    the one or more temporary constraints are defined directly in the constraint solver; and
    the first part and the second part are solved as a single rigid body.

11. The computer-aided design system of claim 8, further comprising instructions to configure the processor to add the one or more temporary constraints based on a user interface gesture to move the first part and the second part rigidly together.

12. The computer-aided design system of claim 8, wherein the first solved position and the second solved position define frames in an animation sequence.

13. The computer-aided design system of claim 12, further comprising instructions to configure the processor to:
    calculate additional frames in the animation sequence, wherein the additional frames are between the first solved position and the second solved position;

construct additional constraints to rigidly tie the driving part and the driven part together; and execute the constraint solver, wherein the additional constraints are input to the constraint solver and the additional frames are output by the constraint solver.

14. A non-transitory computer-readable data storage medium comprising instructions causing a computer to:

select a first part and a second part, the first and second parts being structurally independent of one another;

determine which of the first and second parts are a driving part and a driven part;

apply a new position to one of the driving part and the driven part;

add one or more temporary constraints between the driving part and the driven part if the new position applies to the driving part;

execute a constraint solver to move the first and second parts into a first solved position and a second solved position, respectively; and after execution of the constraint solver, remove the added one or more temporary constraints.

15. The computer-readable data storage medium of claim 14, wherein the structural relationship of the driving part and the driven part at the new position automatically determines the one or more temporary constraints to add.

16. The computer-readable data storage medium of claim 14, wherein:

the one or more temporary constraints are defined directly in the constraint solver; and the first part and the second part are solved as a single rigid body.

17. The computer-readable data storage medium of claim 14, further comprising instructions to configure the processor to add the one or more temporary constraints based on a user interface gesture to move the first part and the second part rigidly together.

18. The computer-readable data storage medium of claim 14, wherein the first solved position and the second solved position define frames in an animation sequence.

19. The computer-aided design system of claim 18, further comprising instructions to configure the processor to:

calculate additional frames in the animation sequence, wherein the additional frames are between the first solved position and the second solved position;

construct additional constraints to rigidly tie the driving part and the driven part together; and execute the constraint solver, wherein the constructed additional constraints are input to the constraint solver and the calculated additional frames are output by the constraint solver.

* * * * *